US012641754B2

(12) United States Patent
Sun et al.

(10) Patent No.: US 12,641,754 B2
(45) Date of Patent: May 26, 2026

(54) VAPOR CHAMBER AND ELECTRONIC DEVICE

(71) Applicant: ZTE Corporation, Shenzhen (CN)

(72) Inventors: Zhen Sun, Shenzhen (CN); Biying Li, Shenzhen (CN); Shuai Li, Shenzhen (CN); Qingsong Xu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 116 days.

(21) Appl. No.: 18/685,617

(22) PCT Filed: Mar. 21, 2022

(86) PCT No.: PCT/CN2022/082123
§ 371 (c)(1),
(2) Date: Feb. 22, 2024

(87) PCT Pub. No.: WO2023/024498
PCT Pub. Date: Mar. 2, 2023

(65) Prior Publication Data
US 2025/0133696 A1 Apr. 24, 2025

(30) Foreign Application Priority Data

Aug. 25, 2021 (CN) .......................... 202110978379.3

(51) Int. Cl.
*H05K 7/20* (2006.01)
(52) U.S. Cl.
CPC ................................ *H05K 7/20336* (2013.01)
(58) Field of Classification Search
CPC .................................................. H05K 7/20336
See application file for complete search history.

(56) References Cited

U.S. PATENT DOCUMENTS 4,838,347 A * 6/1989 Dentini .............. H05K 7/20545
439/91
6,550,531 B1 * 4/2003 Searls ................. F28D 15/0233
165/104.33
(Continued)

FOREIGN PATENT DOCUMENTS

CN 101927426 A 12/2010
CN 203934263 U 11/2014
(Continued)

OTHER PUBLICATIONS

International Search Report for corresponding application PCT/ CN2022/082123 filed Mar. 21, 2022; Mail date May 25, 2022.
(Continued)

*Primary Examiner* — Gordon A Jones
(74) *Attorney, Agent, or Firm* — CANTOR COLBURN LLP

(57) ABSTRACT

The present disclosure relates to the field of heat dissipation technologies, and provides a Vapor Chamber (VC) and an electronic device. The VC includes a first housing and a second housing that are disposed opposite to each other. The first housing and the second housing form a closed chamber. The first housing includes a bottom wall for making contact with a heat source. The second housing has a top wall facing the bottom wall. A first capillary structure is disposed on the bottom wall. The first capillary structure comprises a heat source region capillary structure and a non-heat source region capillary structure. The heat source region capillary structure includes a plurality of convex capillary structures and/or a plurality of first concave capillary structures.

18 Claims, 3 Drawing Sheets

(56)                    References Cited

U.S. PATENT DOCUMENTS

| | | | |
|---|---|---|---|
| 2006/0131002 A1 | 6/2006 | Mochizuki et al. | |
| 2021/0180877 A1 | 6/2021 | Wong | |
| 2021/0356214 A1 * | 11/2021 | Naito | F28D 15/0233 |
| 2023/0121930 A1 * | 4/2023 | Mao | F28D 15/0233 |
| | | | 165/104.26 |
| 2025/0212366 A1 * | 6/2025 | Vasiliev | F28D 15/046 |
| 2026/0075788 A1 * | 3/2026 | Bee | H05K 13/0069 |

FOREIGN PATENT DOCUMENTS

| | | | | |
|---|---|---|---|---|
| CN | 110779369 A | 2/2020 | | |
| CN | 212013418 | 11/2020 | | |
| CN | 112105219 A | 12/2020 | | |
| CN | 112802810 A | 5/2021 | | |
| CN | 113437034 A | 9/2021 | | |
| EP | 4651649 A1 * | 11/2025 | | H10W 40/73 |
| JP | 3181382 U | 1/2013 | | |
| JP | 3185277 U | 7/2013 | | |
| WO | 2020215803 A1 | 10/2020 | | |

OTHER PUBLICATIONS

European Search Report for Application No. 22859853.8, dated Oct. 10, 2024, 6 pages.

* cited by examiner

VAPOR CHAMBER AND ELECTRONIC DEVICE

CROSS-REFERENCE TO RELATED APPLICATION

This invention is a national stage filing under 35 U.S.C. § 371 of international application number PCT/CN2022/082123, filed Mar. 21, 2022, which based upon and claims priority to Chinese Patent Disclosure No. 2021109783793, filed on 25 Aug. 2021, the entire disclosure of which is incorporated herein by reference.

TECHNICAL FIELD

The present disclosure pertains to the field of heat dissipation technologies, and relates to a Vapor Chamber (VC) and an electronic device.

BACKGROUND

With the development of electronic products in the electronics industry towards larger capacity and higher performance, the level of equipment integration of the electronic products gets higher and higher, and power consumption of devices continues to increase significantly, especially for some multi-functional chips, the level of integration also gets higher and higher. This also leads to a continuous increase in heat flux density, which poses a severe challenge to heat dissipation technologies, especially in an air-cooled system, a device with high power consumption faces a problem of excessively large thermal resistance (excessive temperature rise) from an air side to a chip side.

A Vapor Chamber (VC), mainly includes a housing, a capillary structure, and a working medium. The VC is a closed chamber, and is vacuumized to reduce a boiling point of the working medium in the VC, so that a phase change occurs at a relatively low temperature. The liquid working medium in the VC is heated and evaporated in a heat source region, absorbs heat to become vapor, and then fills the entire chamber. The vapor working medium runs into a condensing region where it condenses into liquid and releases heat accumulated during evaporation. The condensed liquid returns to an evaporation heat source under the action of capillary force of the capillary structure. This process is repeated in a vacuum chamber, to diffuse heat from a concentrated region to the entire structure plane. Through phase change heat transfer, an equivalent thermal conductivity coefficient of the VC is much greater than that of metal conductors such as copper/aluminum, which can resolve a heat dissipation problem and meet a space requirement of high-performance electronic components. The VC is widely used in electronic fields such as mobile phones, computers, servers, and display screens.

In the existing VC technologies, a design of the capillary structure adopts uniform copper powder or copper mesh that is sintered, and there is no elaborate design for the heat source region. As a result, evaporation thermal resistance of the capillary structure of the existing VC is excessively large, and then the performance of the VC cannot meet a heat dissipation requirement.

SUMMARY

An embodiment of the present disclosure is to provide a VC, to resolve a technical problem in the conventional art that evaporation thermal resistance of a capillary structure of the VC is excessively large, and then the performance of the VC cannot meet a heat dissipation requirement.

Another embodiment of the present disclosure is to provide an electronic device, to resolve the technical problem in the conventional art that the evaporation thermal resistance of the capillary structure of the VC is excessively large, and then the performance of the VC cannot meet the heat dissipation requirement.

To achieve the purposes, a first aspect of the embodiments of the present disclosure provides a VC, including a first housing and a second housing that are disposed opposite to each other. The first housing and the second housing form a closed chamber.

The first housing includes a bottom wall for making contact with a heat source. The second housing has a top wall facing the bottom wall. A first capillary structure is disposed on the bottom wall. The first capillary structure includes a heat source region capillary structure and a non-heat source region capillary structure. The heat source region capillary structure includes a plurality of convex capillary structures and/or a plurality of first concave capillary structures.

A second aspect of the embodiments of the present disclosure provides an electronic device. The electronic device includes the VC described above.

The VC provided in the embodiments of the present disclosure includes a first housing and a second housing that are disposed opposite to each other. The first housing and the second housing form a closed chamber. The first housing includes a bottom wall for making contact with a heat source. The second housing has a top wall facing the bottom wall. A first capillary structure is disposed on the bottom wall. The first capillary structure includes a heat source region capillary structure and a non-heat source region capillary structure. The heat source region capillary structure includes a plurality of convex capillary structures and/or a plurality of first concave capillary structures. When the VC is in use, the heat source region capillary structure is located directly above the heat source. According to the VC, the plurality of convex capillary structures and/or the plurality of first concave capillary structures are added on the first capillary structure of an evaporation region, which is directly above the heat source, of the VC, so that an evaporation area of a working medium in the VC is increased, thereby reducing evaporation thermal resistance of the working medium in the VC, and resolving a heat dissipation problem of the VC in a chip application scenario with high power consumption and high heat flux density.

The electronic device provided in the embodiments of the present disclosure includes the VC. According to the VC, the plurality of convex capillary structures and/or first concave capillary structures are added on the heat source region capillary structure of the first capillary structure of the evaporation region, which is directly above the heat source, of the VC, so that the evaporation area of the working medium in the VC is increased, thereby reducing the evaporation thermal resistance of the working medium in the VC, and resolving the heat dissipation problem of the VC in the chip application scenario with high power consumption and high heat flux density.

BRIEF DESCRIPTION OF THE DRAWINGS

In order to more clearly illustrate technical solutions in embodiments of the present disclosure, the accompanying drawings needed in description of the embodiments or the conventional art are simply introduced below: It is apparent that the accompanying drawings in the following description are only some embodiments of the present disclosure. Those of ordinary skill in the art may further obtain other accompanying drawings according to these on the premise of not contributing creative effort.

DETAILED DESCRIPTION OF THE EMBODIMENTS

Figure 1:
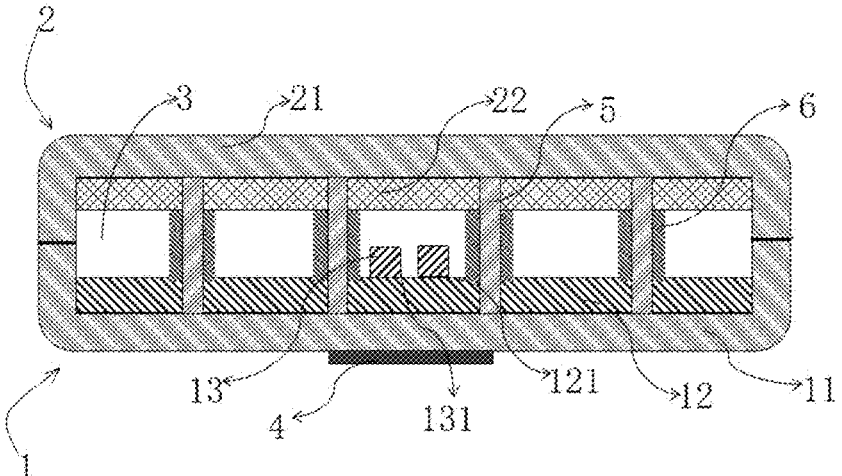
FIG. 1 is a structure diagram of a VC according to an embodiment of the present disclosure.

In order to make purposes, technical solutions and advantages of embodiments of the present disclosure clearer, the embodiments of the present disclosure are described in detail below in combination with the accompanying drawings. However, those of ordinary skill in the art may understand that many technical details are presented in the embodiments of the present disclosure to make the present disclosure better understood by the reader. However, the technical solution claimed by the present disclosure may also be implemented even without these technical details, and changes and modifications based on the following embodiments. Division of the embodiments is merely for ease of description, and should not constitute any limitation on a specific implementation mode of the present disclosure. The embodiments may be combined and referenced with each other without contradiction.

A VC provided in the present disclosure includes a first housing and a second housing that are disposed opposite to each other. The first housing and the second housing form a closed chamber.

The first housing includes a bottom wall for making contact with a heat source. The second housing has a top wall facing the bottom wall. A first capillary structure is disposed on the bottom wall. The first capillary structure includes a heat source region capillary structure and a non-heat source region capillary structure. The heat source region capillary structure includes a plurality of convex capillary structures and/or a plurality of first concave capillary structures.

The VC relies on a continuous phase change and circulation of an internal working medium to diffuse heat concentrated by the heat source and finally diffuse the heat to the external environment. The normal operation of the VC is limited by a limit of the capillary structure, especially in a heat dissipation scenario with high power consumption and high heat flux density, a design of the capillary structure in the VC is more important. In the conventional VC technologies, the design of the capillary structure adopts uniform copper powder or copper mesh that is sintered, and there is no elaborate design for a heat source region. This may cause the following problem: evaporation thermal resistance is excessively large due to the excessively thick capillary structure or excessive injected liquid, and then the performance of the VC cannot meet a heat dissipation requirement.

When the VC provided in the present disclosure is used, the heat source region capillary structure is located directly above the heat source. The plurality of convex capillary structures and/or the plurality of first concave capillary structures are disposed on the heat source region capillary structure of the first capillary structure of an evaporation region, which is directly above the heat source, of the VC, so that an evaporation area of the working medium in the VC is increased, thereby reducing the evaporation thermal resistance of the working medium in the VC, and resolving a heat dissipation problem of the VC in a chip application scenario with high power consumption and high heat flux density.

A VC and an electronic device provided in the present disclosure are described in detail below in combination with specific embodiments.

A first aspect of the embodiments of the present disclosure provides a VC. FIG. 1 is a structure diagram of a VC according to an embodiment of the present disclosure. With reference to FIG. 1, the VC in the embodiment of the present disclosure includes a first housing 1 and a second housing 2 that are disposed opposite to each other. The first housing 1 and the second housing 2 form a closed chamber 3.

The first housing 1 includes a bottom wall 11 for making contact with a heat source 4. The second housing 2 has a top wall 21 facing the bottom wall. A first capillary structure 12 is disposed on the bottom wall 11. The first capillary structure 12 includes a heat source region capillary structure and a non-heat source region capillary structure. A plurality of convex capillary structures 13 are formed on the heat source region capillary structure.

When the VC in the present embodiment is used, the heat source region capillary structure is located directly above the heat source 4. The convex capillary structures 13 is added on the first capillary structure 12 of an evaporation region, which is directly above the heat source, in the VC, so that an evaporation area of a working medium in the VC is increased, thereby reducing evaporation thermal resistance of the working medium in the VC, and resolving a heat dissipation problem of the VC in a chip application scenario with high power consumption and high heat flux density:

In an embodiment, a second capillary structure 22 is disposed on the top wall 21 of the second housing 2. The first housing 1 and the second housing 2 in the present embodiment may be made of metal, an alloy, a composite material, or other materials with a high thermal conductivity. The first capillary structure 12 may be copper powder, a copper mesh, a groove, a fiber bundle, or another porous structure, and is connected to the first housing by sintering, CNC, etching or other processes. The second capillary structure 22 may be copper powder, a copper mesh, a groove, a fiber bundle, or another porous structure, and is connected to the second housing 2 by sintering. CNC, etching or other processes. The first housing 1 and the second housing 2 form a closed chamber by diffusion welding, braze welding, laser welding, or other welding processes. Generally, a tube is disposed on the second housing 2 of the VC, and is configured to vacuumize and inject a liquid working medium. The tube is not shown in the figure of the present embodiment. After the closed chamber is vacuumized and sealed, the closed chamber formed by the first housing 1 and the second housing 2 forms a vapor chamber.

Figure 2:
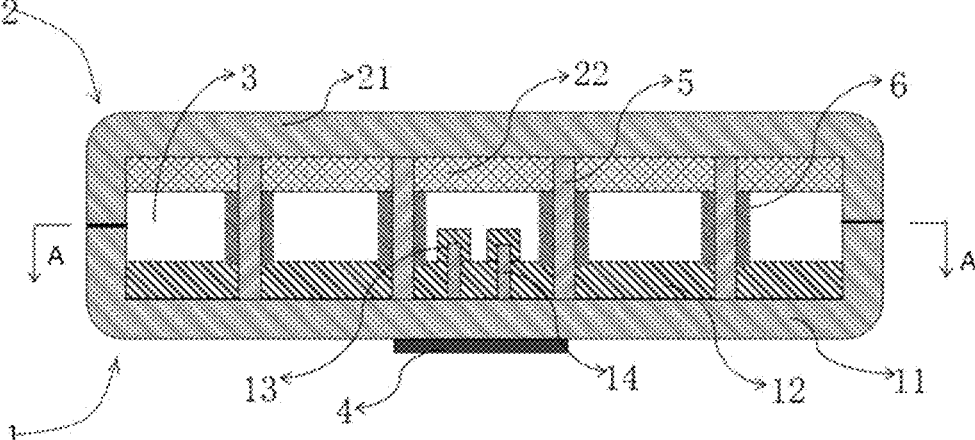
FIG. 2 is a structure diagram of a VC according to an embodiment of the present disclosure.
Figure 3:
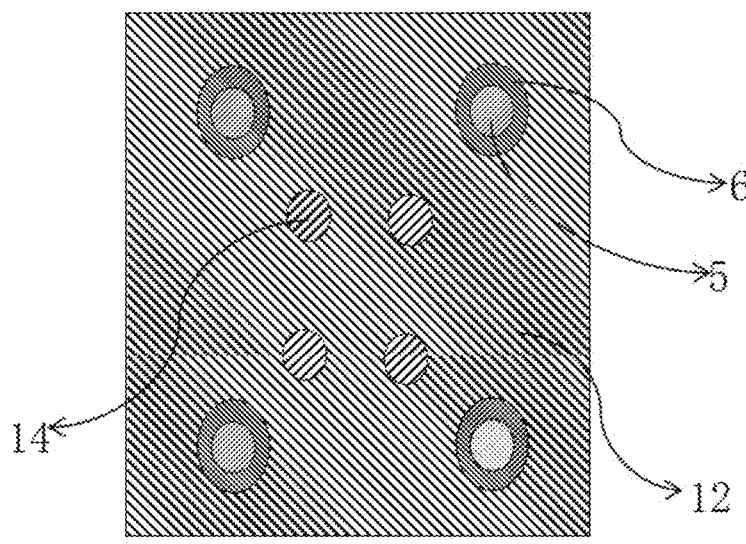
FIG. 3 is a partial structure diagram of an A-A section in FIG. 2.

FIG. 2 is a structure diagram of a VC according to an embodiment of the present disclosure. FIG. 3 is a partial structure diagram of an A-A section in FIG. 2. With reference to FIG. 2 and FIG. 3, in a specific embodiment, a first heat conduction convex column 14 is disposed on the bottom wall 11. One end of the first heat conduction convex column 14 is fastened to the bottom wall 11, and the other end of the first heat conduction convex column 14 is located in the convex capillary structure 13. The heat source 4 is disposed below the first housing 1. In the present embodiment, the first heat conduction convex column 14 is disposed directly above the heat source in the VC, and is connected to the bottom wall 11 of the first housing. The first heat conduction convex column 14 may be made of metal, an alloy, a composite material, or other materials with a high thermal conductivity, and is closely combined with the first housing 1 by diffusion welding or other welding processes, or is formed by machining the first housing 1. The first heat conduction convex column 14 is covered with the convex capillary structure 13. The convex capillary structure 13 may be copper powder, a copper mesh, a groove, a fiber bundle, or another porous structure, and is connected to the first heat conduction convex column 14 by sintering. CNC, etching or other processes. Specifically, the diameter of the first heat conduction convex column 14 may be a few tenths of a millimeter to several millimeters, and the height of the first heat conduction convex column 14 may be a few tenths of a millimeter to several millimeters.

In an embodiment, the first heat conduction convex column 14 is vertically disposed on the bottom wall 11, and heat conduction effect is good.

In an embodiment, there are a plurality of first heat conduction convex columns 14, and the plurality of first heat conduction convex columns 14 are spaced. In the present embodiment, the plurality of first heat conduction convex columns 14 are disposed, so that an evaporation surface area of the liquid working medium in the closed chamber 3 of the VC is greatly increased.

Figure 4:
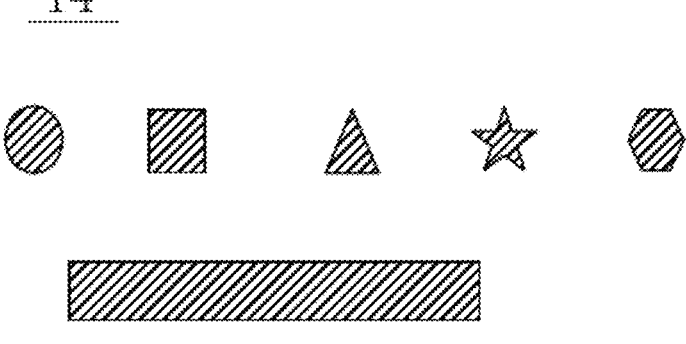
FIG. 4 is a structure diagram of a cross section of a first heat conduction convex column of a VC according to an embodiment of the present disclosure.

FIG. 4 is a structure diagram of a cross section of a first heat conduction convex column of a VC according to an embodiment of the present disclosure. With reference to FIG. 4, shapes of cross sections of the first heat conduction convex column 14 and the convex capillary structure 13 are the same. In an example, the shapes of cross sections of the first heat conduction convex column 14 and the convex capillary structure 13 are circular, rectangular, triangular, polygonal, or star-shaped. In the present embodiment, the cross sections of the first heat conduction convex column 14 and the convex capillary structure 13 may be in circular, rectangular, triangular, polygonal, elongated or other similar shapes, or a combination of these shapes. In the present embodiment, the shapes of the cross sections of the first heat conduction convex column 14 and the convex capillary structure 13 are not specifically limited.

Figure 5:
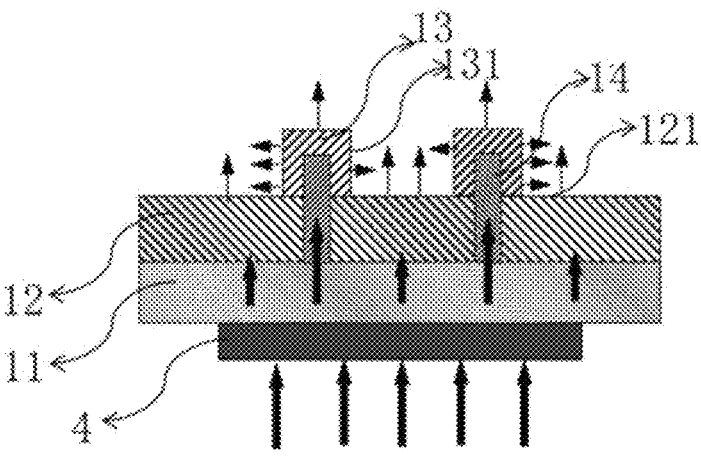
FIG. 5 is a structure diagram of a working principle of a VC according to an embodiment of the present disclosure.

FIG. 5 is a structure diagram of a working principle of a VC according to an embodiment of the present disclosure. With reference to FIG. 2 and FIG. 5, a technical principle of the embodiment of the present disclosure is as follow: heat is introduced from the heat source 4, and is conducted to the first capillary structure 12 through the first housing 1, and the liquid working medium absorbs the heat in the first capillary structure 12 and evaporates on a surface 121 of the first capillary structure to take away the heat. At the same time, the heat is conducted, through the first heat conduction convex column 14, to the convex capillary structure 13 covered on an outer layer of the first heat conduction convex column 14, and the liquid working medium absorbs the heat and evaporates on a surface 131 of the convex capillary structure. The evaporation surface area of the liquid working medium is greatly increased due to the existence of the convex capillary structure 13 and the first heat conduction convex column 14.

Figure 6:
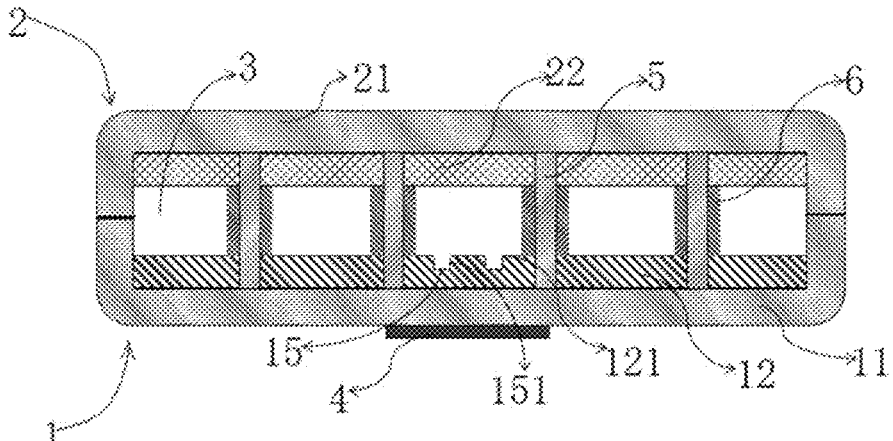
FIG. 6 is a structure diagram of a VC according to an embodiment of the present disclosure.

FIG. 6 is a structure diagram of a VC according to an embodiment of the present disclosure. With reference to FIG. 6, in a specific embodiment, the VC includes a first housing 1 and a second housing 2 that are disposed opposite to each other. The first housing 1 and the second housing 2 form a closed chamber 3.

The first housing 1 includes a bottom wall 11 for making contact with a heat source 4. The second housing 2 has a top wall 21 facing the bottom wall 11. A first capillary structure 12 is disposed on the bottom wall 11. A second capillary structure 22 is disposed on the top wall 21. The first capillary structure 12 includes a heat source region capillary structure and a non-heat source region capillary structure. A plurality of first concave capillary structures 15 are formed on the heat source region capillary structure. In a specific example, a shape of a cross section of the first concave capillary structure 15 is circular, rectangular, triangular, polygonal, or star-shaped.

In an embodiment, the first concave capillary structure 15 is copper powder, a copper mesh, a groove, a fiber bundle, or another porous structure, is formed by laser, etching, or other processes, or is integrally sintered with the first capillary structure 12. The diameter of the first concave capillary structure 15 is a few tenths of a millimeter to several millimeters, and the depth of concavity is a few tenths of a millimeter to several millimeters. The cross section of the first concave capillary structure 15 may be in circular, rectangular, triangular, polygonal, elongated or other similar shapes, or a combination of these shapes, which is not specifically limited in the present embodiment.

When the VC in the present embodiment is used, the heat source region capillary structure is located directly above the heat source 4, a liquid working medium absorbs heat in the first capillary structure 12 and evaporates on a surface 121 of the first capillary structure to take away the heat. The first concave capillary structure 15 is added on the first capillary structure 12 of an evaporation region, which is directly above the heat source, in the VC, so that the liquid working medium absorbs heat and evaporates on a surface 151 of the first concave capillary structure, and an evaporation area of the working medium in the VC is increased, thereby reducing evaporation thermal resistance of the working medium in the VC, and resolving a heat dissipation problem of the VC in a chip application scenario with high power consumption and high heat flux density.

Figure 7:
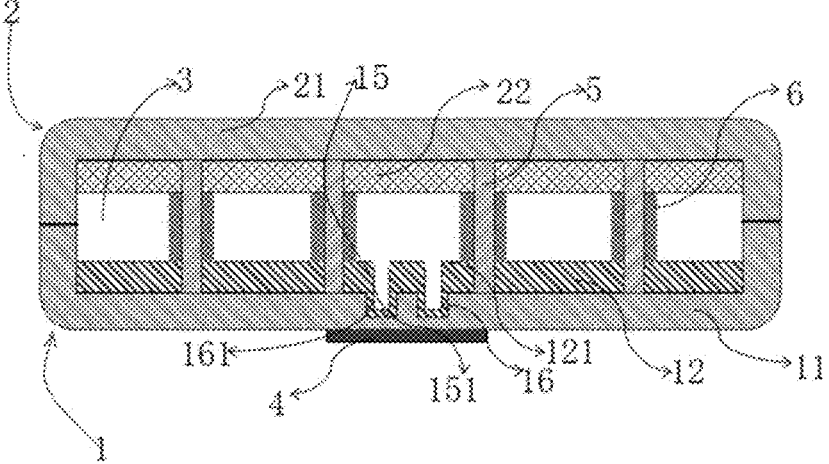
FIG. 7 is a structure diagram of a VC according to an embodiment of the present disclosure.

FIG. 7 is a structure diagram of a VC according to an embodiment of the present disclosure. With reference to FIG. 7, there is further a concave structure on the bottom wall 11. A third capillary structure is disposed on an inner wall of the concave structure. The third capillary structure has a second concave capillary structure 16. The first concave capillary structure 15 is connected to the second concave capillary structure 16. The concave structure is disposed on the bottom wall 11, and the second concave capillary structure 16 is disposed on the inner wall of the concave structure, so that an area of the concave structure is increased.

The first capillary structure 12 of the VC in the above embodiments include the first concave capillary structure 15, there is the concave structure on the bottom wall 11, the third capillary structure is disposed on the inner wall of the capillary structure, and the third capillary structure has the second concave capillary structure 16. When the VC is in use, the heat source region capillary structure is located directly above the heat source 4, the liquid working medium absorbs heat in the first capillary structure 12 and evaporates on the surface 121 of the first capillary structure to take away the heat. The second concave capillary structure 16 is formed on the third capillary structure, so that the liquid working medium absorbs heat and evaporates on the surface 151 of the first concave capillary structure and a surface 161 of the second concave capillary structure, and the evaporation area of the working medium in the VC is increased, thereby reducing the evaporation thermal resistance of the working medium in the VC, and resolving the heat dissipation problem of the VC in the chip application scenario with high power consumption and high heat flux density.

Figure 8:
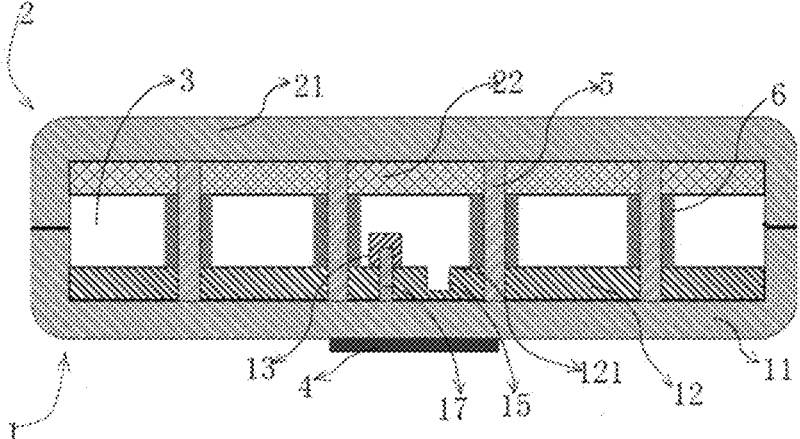
FIG. 8 is a structure diagram of a VC according to an embodiment of the present disclosure.

FIG. 8 is a structure diagram of a VC according to an embodiment of the present disclosure. With reference to FIG. 8, in a specific embodiment, the VC includes a first housing 1 and a second housing 2 that are disposed opposite to each other. The first housing 1 and the second housing 2 form a closed chamber 3.

The first housing 1 includes a bottom wall 11 for making contact with a heat source 4. The second housing 2 has a top wall 21 facing the bottom wall. A first capillary structure 12 is disposed on the bottom wall 11. A second capillary structure 22 is disposed on the top wall 21. The first capillary structure 12 includes a heat source region capillary structure and a non-heat source region capillary structure. A convex capillary structure 13 and a first concave capillary structure 15 are formed on the heat source region capillary structure. The convex capillary structure 13 and the first concave capillary structure 15 are spaced. In the present embodiment, there are a plurality of convex capillary structures 13, and the plurality of convex capillary structures 13 are spaced. There are a plurality of first concave capillary structures 15, and the plurality of first concave capillary structures 15 are spaced. The quantity and arrangement of the convex capillary structures 13 and the first concave capillary structures 15 are not specifically limited in the present embodiment.

In an embodiment, a second heat conduction convex column 17 is disposed on the bottom wall 11. One end of the second heat conduction convex column 17 is fastened to the bottom wall 11, and the other end of the second heat conduction convex column 17 is located in the convex capillary structure 13. The second heat conduction convex column 17 is disposed in the convex capillary structure 13, so that an evaporation surface area of a liquid working medium in the VC is increased.

A combination of the convex capillary structure 13 and the first concave capillary structure 15 is formed on the heat source region capillary structure in the present embodiment. The convex capillary structure 13 is copper powder, a copper mesh, a groove, a fiber bundle, or another porous structure, and is connected to the convex column by sintering. CNC, etching or other processes. The first concave capillary structure 15 is copper powder, a copper mesh, a groove, a fiber bundle, or another porous structure, is formed by laser, etching, or other processes, or is integrally sintered with the first capillary structure 12.

The VC according to the present embodiment includes the first housing and the second housing that are disposed opposite to each other. The first housing and the second housing form the closed chamber. The first housing includes the bottom wall for making contact with the heat source. The second housing has the top wall facing the bottom wall. The first capillary structure is disposed on the bottom wall. The second capillary structure is disposed on the top wall. The first capillary structure includes the heat source region capillary structure and the non-heat source region capillary structure. The convex capillary structure and the first concave capillary structure are formed on the heat source region capillary structure. When the VC is used, the heat source region capillary structure is located directly above the heat source, and the convex capillary structure and the first concave capillary structure are added on the first capillary structure of the evaporation area, which is directly above the heat source, in the VC, so that the evaporation area of the working medium in the VC is increased, thereby reducing the evaporation thermal resistance of the working medium in the VC, and resolving the heat dissipation problem of the VC in the chip application scenario with high power consumption and high heat flux density:

A convex capillary structure form of a basic embodiment structure of the VC in the present disclosure is shown in FIG. 1 and FIG. 2, and a concave capillary structure form is shown in FIG. 6 and FIG. 7. FIG. 8 illustrates only a combination of the convex capillary structure form and the concave capillary structure form (a combination of FIG. 2 and FIG. 6). Any combination of the structures shown in FIG. 1, FIG. 2. FIG. 6, and FIG. 7 is within the scope of protection of the present disclosure.

In the above embodiments, structures of the first capillary structure 12 and the second capillary structure 22 are the same or different. The specific structures of the first capillary structure 12 and the second capillary structure 22 are not specifically limited in the above embodiments.

In the above embodiments, there are a plurality of convex capillary structures 13, and the plurality of convex capillary structures 13 are spaced. There are a plurality of first concave capillary structures 15, and the plurality of first concave capillary structures 15 are spaced. The plurality of convex capillary structures 13 and first concave capillary structures 15 are disposed, so that the evaporation area of the working medium in the VC can be greatly increased, thereby reducing the evaporation thermal resistance of the working medium in the VC to a greater extent.

In an embodiment, there is a support column 5 disposed between the bottom wall 11 and the top wall 21. One end of the support column 5 is fastened to the top wall 21, and the other end of the support column 5 is fastened to the bottom wall 11. This prevents depression of the closed chamber 3 in the VC.

There is a liquid backflow structure 6 disposed between the first capillary structure 12 on the bottom wall 11 and the second capillary structure 22 on the top wall 21. The liquid backflow structure 6 is sleeved on a side wall of the support column 5. The liquid backflow structure 6 is disposed, so that condensed liquid working medium can be guided to flow back to the evaporation region. The liquid backflow structure 6 between the first capillary structure 12 and the second capillary structure 22 connects the first capillary structure 12 to the second capillary structure 22. The liquid backflow structure 6 may be copper powder, a copper mesh, a groove, a fiber bundle, or another porous structure that is sintered. The backflow structure in the present embodiment can reduce a backflow path of the liquid working medium, thereby improving an evaporation speed and improving heat dissipation efficiency.

A second aspect of the embodiments of the present disclosure provides an electronic device. The electronic device includes the VC described in the above embodiments.

In an embodiment, the VC includes a first housing and a second housing that are disposed opposite to each other. The first housing and the second housing form a closed chamber.

The first housing includes a bottom wall for making contact with a heat source. The second housing has a top wall facing the bottom wall. A first capillary structure is disposed on the bottom wall. The first capillary structure includes a heat source region capillary structure and a non-heat source region capillary structure. The heat source region capillary structure includes a plurality of convex capillary structures and/or a plurality of first concave capillary structures.

The electronic device provided in the embodiments of the present disclosure includes the VC. According to the VC, the plurality of convex capillary structures and/or the plurality of first concave capillary structures are included in the heat source region capillary structure of the first capillary structure of an evaporation region, which is directly above the heat source, of the VC, so that an evaporation area of a working medium in the VC is increased, thereby reducing evaporation thermal resistance of the working medium in the VC, and resolving a heat dissipation problem of the VC in a chip application scenario with high power consumption and high heat flux density.

In the above descriptions, the descriptions made with reference to terms "an embodiment". "some embodiments", "example", "specific example", "some examples", and the like refer to that specific features, structures, materials or characteristics described in combination with the embodiment or the example are included in at least one embodiment or example of the present disclosure. In the specification, these terms are not always schematically expressed for the same embodiment or example. Moreover, the specific described features, structures, materials or characteristics may be combined in a proper manner in any one or more embodiments or examples. In addition, those skilled in the art may combine different embodiments or examples described in the specification and features of different embodiments or examples without contradiction.

The above embodiments are only intended for describing, but not limiting, the technical solutions of the present disclosure. Although the present disclosure is described in detail with reference to the above embodiments, those of ordinary skill in the art should understand that they may still make modifications to the technical solutions described in the above embodiments or make equivalent replacements to some or all technical features thereof, without departing from the scope of the technical solutions of the embodiments of the present disclosure.

What is claimed is:

1. A vapor chamber, comprising:
a first housing and a second housing that are disposed opposite to each other, wherein the first housing and the second housing form a closed chamber; and
the first housing comprises a bottom wall for making contact with a heat source, and the second housing has a top wall facing the bottom wall, wherein a first capillary structure is disposed on the bottom wall, the first capillary structure comprises a heat source region capillary structure and a non-heat source region capillary structure, and the heat source region capillary structure comprises a plurality of convex capillary structures and a plurality of first concave capillary structures;
a first heat conduction convex column is disposed on the bottom wall; and one end of the first heat conduction convex column is fastened to the bottom wall, and the other end of the first heat conduction convex column is located in one of the plurality of convex capillary structures;
wherein there is a concave structure on the bottom wall, a third capillary structure is disposed on an inner wall of the concave structure, the third capillary structure has a second concave capillary structure, and one of the plurality of first concave capillary structures is connected to the second concave capillary structure.

2. The vapor chamber according to claim 1, wherein a second capillary structure is disposed on the top wall.

3. The vapor chamber according to claim 1, wherein the first heat conduction convex column is vertically disposed on the bottom wall.

4. The vapor chamber according to claim 3, wherein a quantity of the first heat conduction convex columns is the same as a quantity of the plurality of convex capillary structures, and the first heat conduction convex columns and the plurality of convex capillary structures are disposed in a one-to-one correspondence.

5. The vapor chamber according to claim 4, wherein shapes of cross sections of the first heat conduction convex column and the plurality of convex capillary structures are the same, and the shapes of the cross sections of the first heat conduction convex column and the plurality of convex capillary structures are circular, rectangular, triangular, polygonal, or star-shaped.

6. The vapor chamber according to claim 1, a shape of a cross section of each of the plurality of first concave capillary structures is circular, rectangular, triangular, polygonal, or star-shaped.

7. The vapor chamber according to claim 6, a third capillary structure is disposed on an inner wall of the concave structure, the third capillary structure has a second concave capillary structure, and one of the plurality of first concave capillary structures is connected to the second concave capillary structure.

8. The vapor chamber according to claim 1, wherein when the heat source region capillary structure comprises the plurality of convex capillary structures and the plurality of first concave capillary structures, the plurality of convex capillary structures structure and the plurality of first concave capillary structures are spaced.

9. The vapor chamber according to claim 8, wherein a second heat conduction convex column is disposed on the bottom wall, one end of the second heat conduction convex column is fastened to the bottom wall, and the other end of the second heat conduction convex column is located in one of the plurality of convex capillary structures.

10. The vapor chamber according to claim 2, wherein structures of the plurality of first capillary structures and the second capillary structure are the same or different.

11. The vapor chamber according to claim 10, wherein there is a support column disposed between the bottom wall and the top wall, one end of the support column is fastened to the top wall, and the other end of the support column is fastened to the bottom wall.

12. The vapor chamber according to claim 11, wherein there is a liquid backflow structure disposed between the plurality of first capillary structures on the bottom wall and the second capillary structure on the top wall.

13. The vapor chamber according to claim 12, wherein the liquid backflow structure is sleeved on a side wall of the support column.

14. An electronic device, wherein the electronic device comprises a vapor chamber, and the vapor chamber comprises:
a first housing and a second housing that are disposed opposite to each other, wherein the first housing and the second housing form a closed chamber; and
the first housing comprises a bottom wall for making contact with a heat source, and the second housing has a top wall facing the bottom wall, wherein a first capillary structure is disposed on the bottom wall, the first capillary structure comprises a heat source region capillary structure and a non-heat source region capillary structure, and the heat source region capillary structure comprises a plurality of convex capillary structures and/or a plurality of first concave capillary structures;

a first heat conduction convex column is disposed on the bottom wall; and one end of the first heat conduction convex column is fastened to the bottom wall, and the other end of the first heat conduction convex column is located in one of the plurality of convex capillary structures;

wherein there is a concave structure on the bottom wall, a third capillary structure is disposed on an inner wall of the concave structure, the third capillary structure has a second concave capillary structure, and one of the plurality of first concave capillary structures is connected to the second concave capillary structure.

15. An electronic device according to claim 14, wherein a second capillary structure is disposed on the top wall.

16. An electronic device according to claim 14, wherein the first heat conduction convex column is vertically disposed on the bottom wall.

17. The vapor chamber according to claim 1, wherein a tube is disposed on the second housing.

18. The vapor chamber according to claim 1, wherein the heat source is disposed below the first housing.

\* \* \* \* \*